United States Patent [19]
Watson

[11] Patent Number: 4,967,173
[45] Date of Patent: Oct. 30, 1990

[54] SHORT AIRLINE CALIBRATION STANDARDS AND METHODS FOR ERROR-CORRECTED MICROWAVE NETWORK ANALYSIS

[75] Inventor: Paul B. Watson, Santa Rosa, Calif.

[73] Assignee: Hewlett-Packard Company, Palo Alto, Calif.

[21] Appl. No.: 396,506

[22] Filed: Aug. 21, 1989

[51] Int. Cl.$^5$ .............................................. H01P 1/04
[52] U.S. Cl. ..................................... 333/260; 439/583
[58] Field of Search ............... 333/160, 243, 245, 260; 324/601; 439/578, 583, 843

[56] References Cited

U.S. PATENT DOCUMENTS

| | | | |
|---|---|---|---|
| 3,340,495 | 9/1967 | Weinschel | 439/578 |
| 4,648,683 | 3/1987 | Botka | 439/583 |
| 4,687,279 | 8/1987 | Holland et al. | 439/578 |
| 4,779,067 | 10/1988 | Johanson | 333/245 X |
| 4,824,399 | 4/1989 | Bogar et al. | 333/260 X |
| 4,845,423 | 7/1989 | Pollard | 333/243 X |

Primary Examiner—Paul Gensler
Attorney, Agent, or Firm—William C. Milks, III

[57] ABSTRACT

A precision transmission line in the form of a short airline, and calibration of a network analyzer using the short airline, are disclosed. The short airline is approximately one-quarter wavelength at the middle frequency of the measurement frequency range. One embodiment comprises a very short coaxial airline. The inner conductor is connected by an adapter to a mating inner conductor, such as the inner conductor of the network analyzer test port. For reliable interface at the other end of the inner conductor, a precision coaxial connector is preferably provided for connection to a device under test. The outer conductor is then attached coaxially to the inner conductor between the network analyzer test port and the device under test. The electrically short airline provides a very precise element for use in the TRL (Thru-Reflect-Line), as well as other, calibrations of network analyzers.

16 Claims, 19 Drawing Sheets

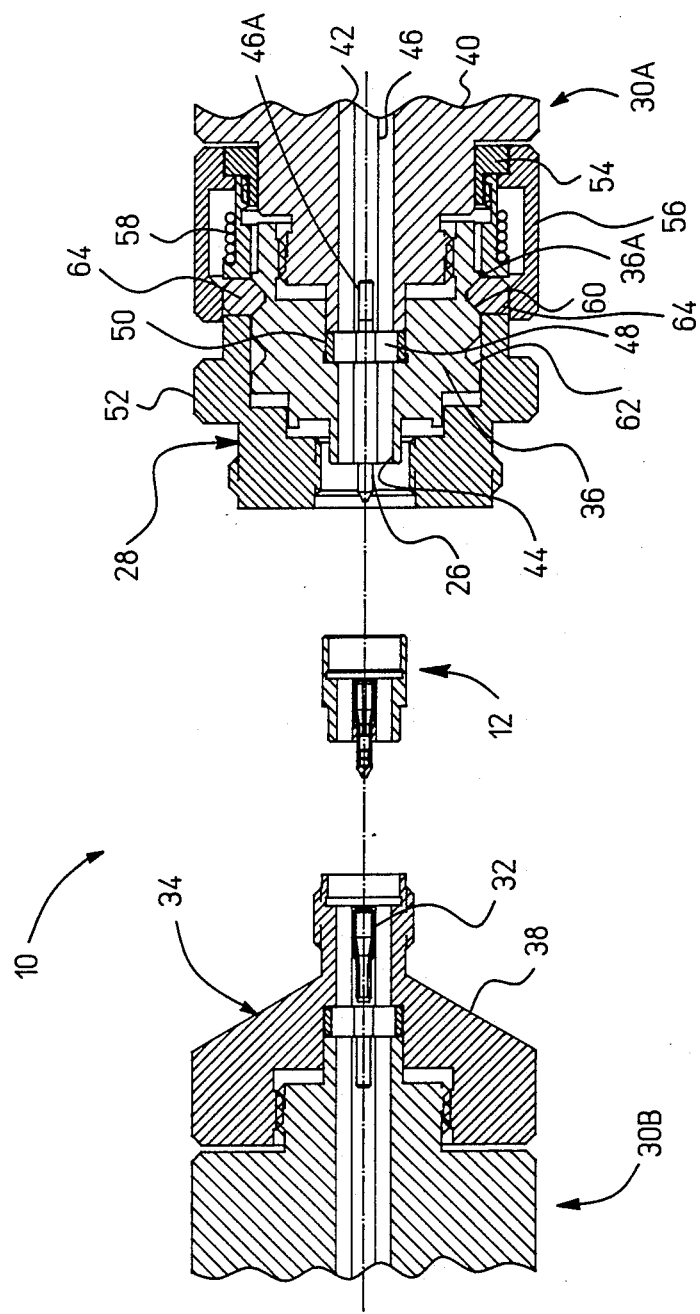

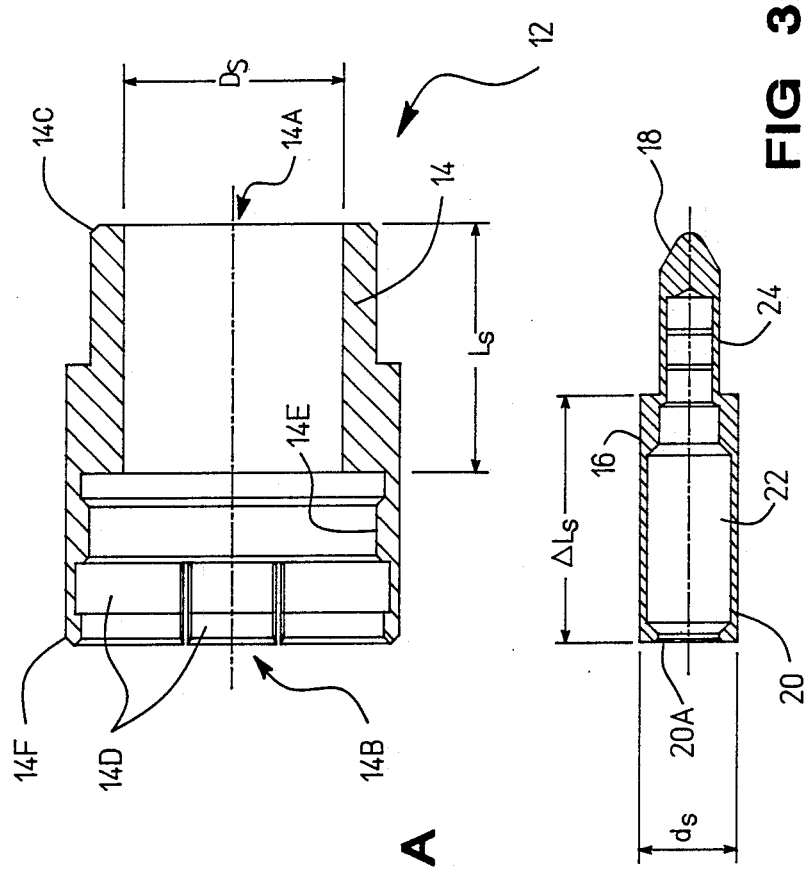

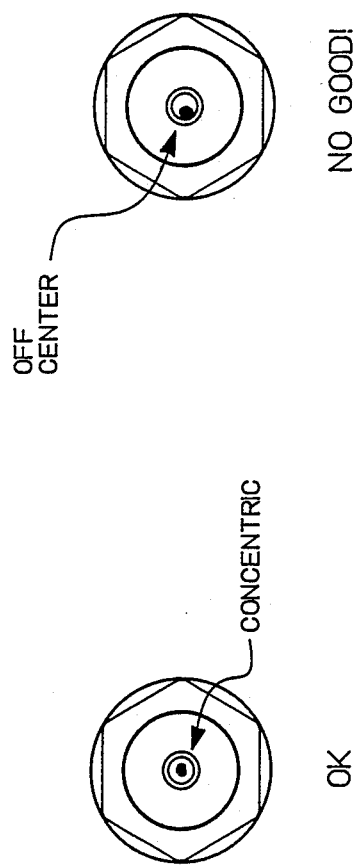

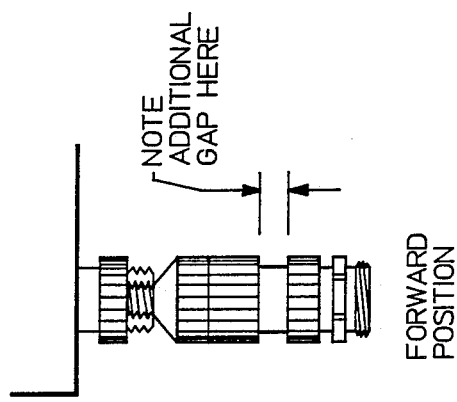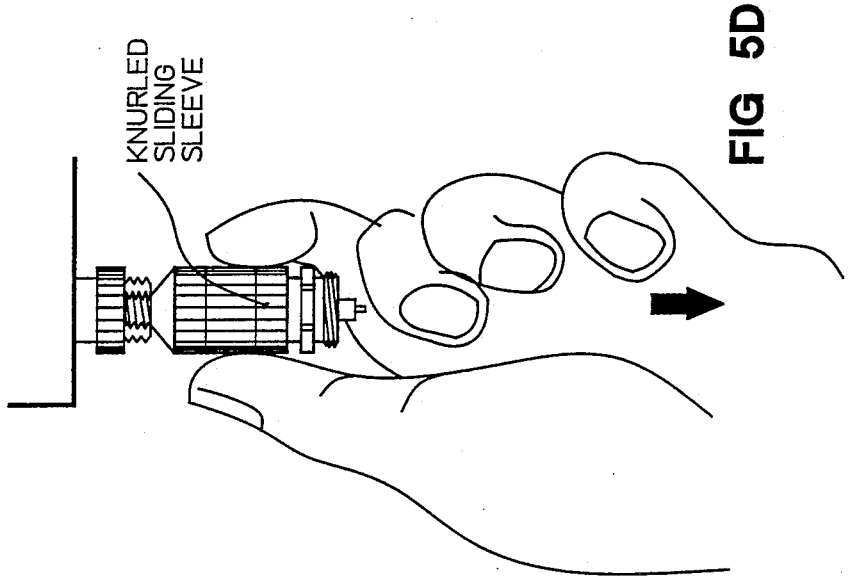

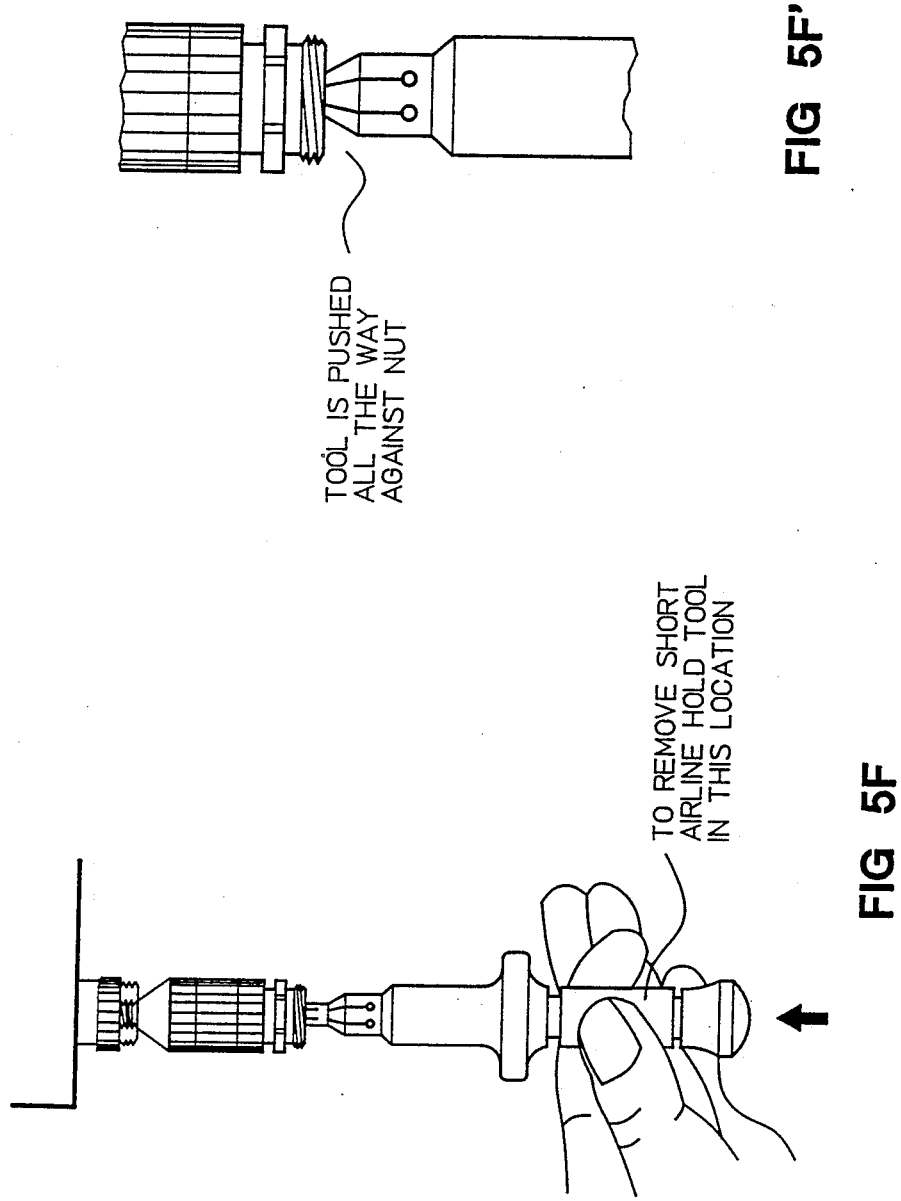

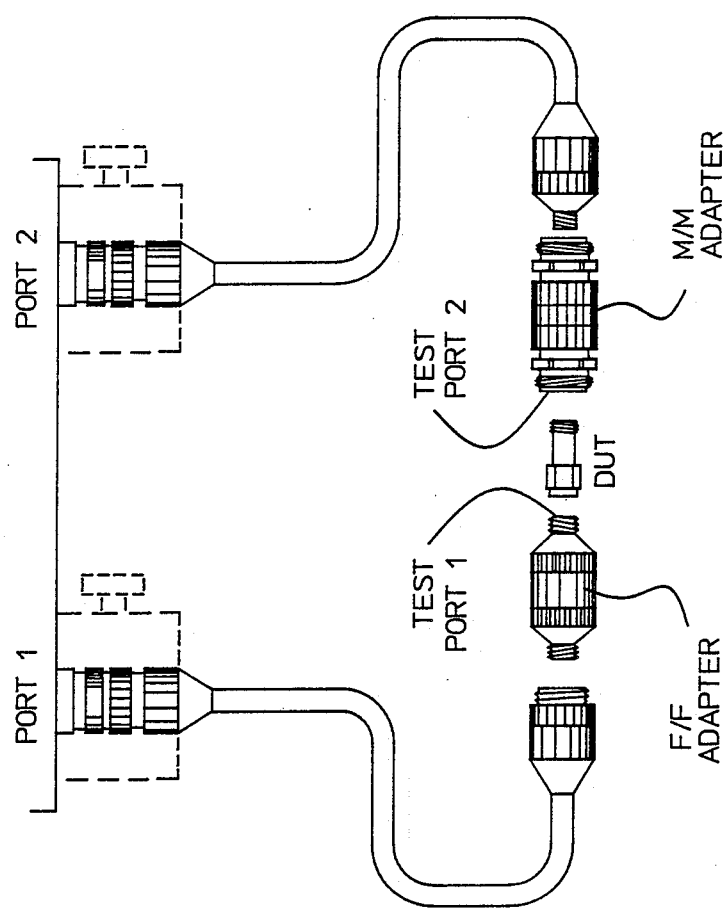

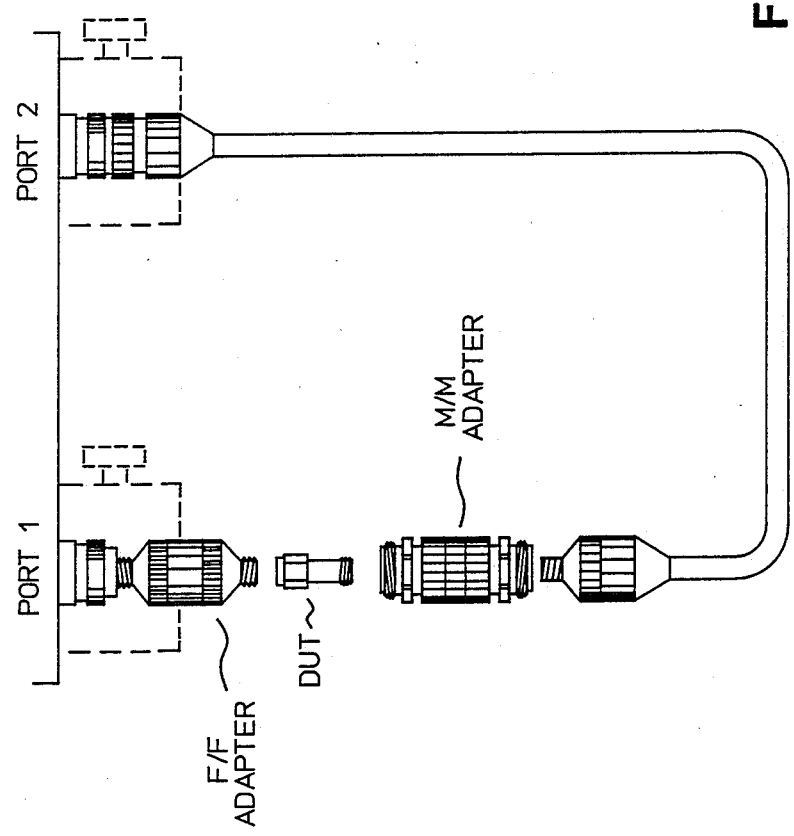

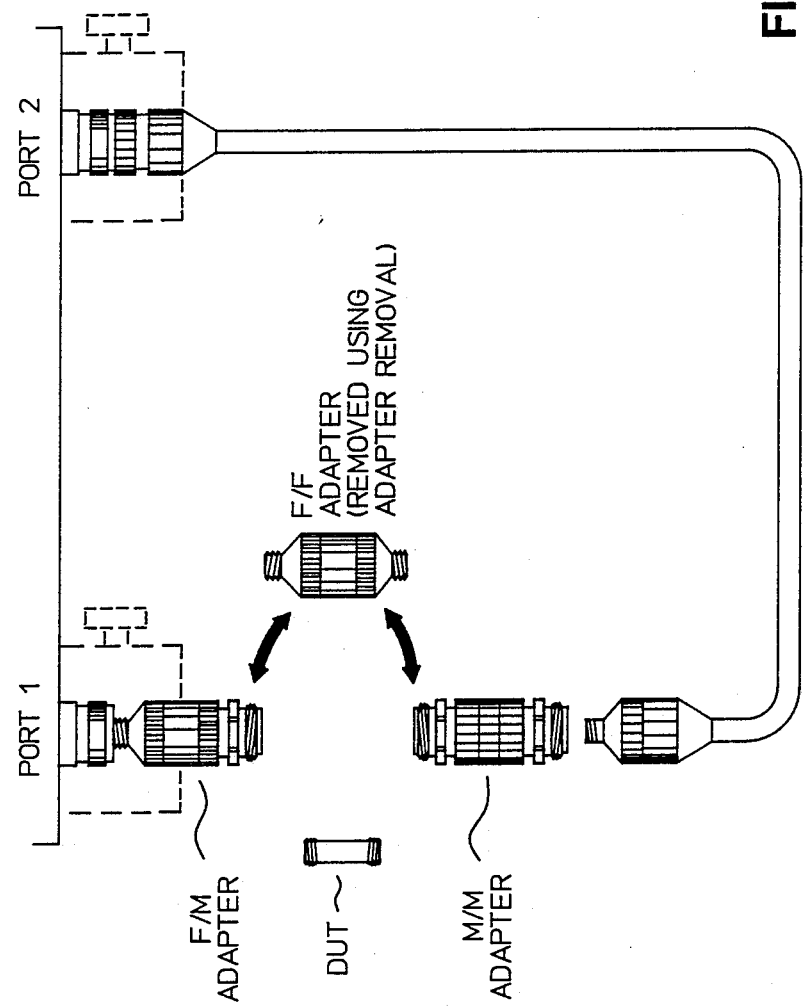

SHORT AIRLINE CALIBRATION STANDARDS AND METHODS FOR ERROR-CORRECTED MICROWAVE NETWORK ANALYSIS

BACKGROUND OF THE INVENTION

This invention relates to network analysis and, more particularly, to error correction of network analyzers employed for electrical circuit measurements. Specifically, one embodiment of the invention provides a very short length of precision coaxial transmission line, connected by a fixture to at least one test port of a high performance microwave vector network analyzer, as a standard for error correction, or calibration, and the use of this standard for error-correcting, or calibrating, such a network analyzer.

Network analyzers are universally used for determining response characteristics of various devices under test, such as filter circuits (or more complex electrical circuits), in order to characterize the device or test it to assure that it meets specifications. The devices under test are either one-port or two-port circuits. The accuracy of a network analyzer depends not only upon the design of the analyzer, but also upon calibration of the analyzer.

Accordingly, various one-port and two-port techniques have been developed for calibrating network analyzers. Known calibration techniques vary in complexity and accuracy.

Typically, these calibration techniques have involved the use of open-, short-, and load-circuit electrical measurements. In traditional one-port calibration techniques, the test port of the network analyzer is open-circuited, and a measurement is taken. This process is repeated with the test port short-circuited, and finally with an impedance-matched load connected across the test port. These measurements are then utilized to calibrate the network analyzer. In traditional two-port calibration techniques, these same measurements are taken for each test port of the network analyzer individually, and, additionally, another measurement is taken by connecting the two test ports together to measure transmission. Often, these techniques employ sliding loads and/or transmission lines that have lengths that are long relative to the wavelengths at the measurement frequencies of interest.

When a length of transmission line is used in connection with the calibration technique, the electrical measurement depends upon the mechanical accuracy of the transmission line. The challenge is therefore to construct a precision transmission line having a known fixed characteristic impedance ($Z_0$) when inserted into a network analyzer measurement configuration between the test port or ports of the analyzer, on the one hand, and, in some instances, a load or short, on the other hand. This characteristic impedance should be accurately known to many decimal places.

Until recently, the largest contributor to network analyzer measurement uncertainty has been the lack of accurate and traceable calibration standards. The second largest contributor has been the poor repeatability of the connectors on the standards and the test ports calibrated by them.

In this latter regard, problems have arisen with the connection of the inner conductor of known precision coaxial transmission lines. Heretofore, contact between the inner conductors of the coaxial transmission line and the network analyzer test port, or load or short, has been effected by collets or a pin-in-socket connection.

One known coaxial transmission line, available from various manufacturers, comprises an inner conductor rod having recesses formed in the ends. A collet, such as an APC-7 (trademark of Amphenol Corporation) snowflake, is inserted into the recess at each end of the conductor rod. The inner conductor is supported by insulators, or beads, typically disposed near the ends of the conductor rod in the interstitial space between the rod and the barrel of the surrounding coaxial outer conductor. Unfortunately, the insulators adversely affect performance. Also, connections are not highly repeatable due to the variable compliance of the collets when the conductor rod is interfaced with similar collets associated with the mating inner conductors of the network analyzer test port and load or short.

Another known coaxial transmission line, for example, included in the Model Number HP 11637A calibration kit, available from Hewlett-Packard Company of Palo Alto, California, comprises an inner conductor rod which is not supported by insulators. The rod is shorter than the outer conductor, and also shorter than the distance to be spanned by the inner conductor. A pin is formed at each end of the rod and extends outwardly away from the rod end into contact with a socket provided in the mating inner conductor of the network analyzer test port or load or short, as the case may be, opposite the rod end. The outer conductor surrounds the inner conductor and is typically provided with a threaded collar for engagement with a threaded sleeve extending from the test port or load or short. Unfortunately, the rod can be radially offset from the centerline of the structure to which the coaxial transmission line is connected, the conductor rod can be longitudinally shifted with respect to the outer conductor, or the inner conductor can bow.

An improved pin-in-socket connection is found in the Model Number 2653, available from Maury Microwave Corporation of Cucamonga, California, in which contact between the inner conductors is effected by a spring mechanism. The ends of the rod are provided with recesses. A spring-loaded pin resides in the recess at each end of the rod and is biased outwardly away from the rod end into contact with a socket provided in the mating inner conductor of the network analyzer test port or load or short opposite the rod end. Additionally, the inner conductor rod has conical ends, and countersinks are provided in the mating inner conductors of the network analyzer test port, load, or short to aid in aligning the inner conductors, but axial shift and bowing problems persist.

These misalignment problems and asymmetries result in irreproducibility of connections required for accurate network analyzer calibration. Therefore, it is desirable to provide a more accurate and repeatable connection between the coaxial transmission line and the network analyzer test port, load, or short.

However, the optimum length of the coaxial transmission line is typically calculated based upon the required frequency of operation for the calibration. In some cases, the desired length is very short.

When conventional interface dimensions of pin-in-socket connectors are examined, the desired length for the coaxial transmission line can be exceeded when a conventional male and female coupling mechanism is used. The typical coupling dimensions of the pin-insocket connector make the outer conductor physically impossible to construct.

Considered in more detail, a cross-sectional view of the construction of a known coaxial airline with complete male and female connectors on the outer conductor is shown in FIG. 1. The conventional coaxial airline shown in FIG. 1 has to be long enough to accommodate a male nut, with it's snap ring, and the threads of the coaxial airline at the female end connected to the test port. With no length available for the standard coupling features if the coaxial airline were to have a shorter length, connection to effect calibration would not be possible. It is therefore desirable to overcome the limitations imposed on the length of the coaxial airline used for calibration.

A precision coaxial transmission line in the form of a very short coaxial airline is disclosed in copending U.S. patent application SC/Ser. No. 07/099,434, filed on Sept. 21, 1987, now U.S. Pat. No. 4,845,423, issued on July 4, 1989, and assigned to the same assignee as this patent application. The short airline is approximately one-quarter wavelength at the middle frequency of the measurement frequency range over which the network analyzer is calibrated. The inner and outer conductors are separate. The inner conductor is threadedly connected to a mating inner conductor, such as the inner conductor of the network analyzer test port. For reliable interface at the other end of the inner conductor, a precision coaxial connector is preferably provided for connection to the inner conductor of a device under test. The outer conductor of the short coaxial airline is then attached coaxially with the inner conductor between the network analyzer test port and the device under test. The lengths of the inner and outer conductors of the short coaxial airline are identical. Because the inner and outer conductors are the identical length and the coaxial airline is short, for example, 7 mm, the inner conductor is not bowed. Also, the inner conductor is properly centered. Nevertheless, the use of this threaded connection with the inner conductor can require modification of the center conductor of the test port. Also, the repeatability of the connection at the other end of the inner conductor is not substantially improved.

SUMMARY OF THE INVENTION

The present invention provides in one embodiment a calibration standard comprising a precision coaxial transmission line in the form of a very short coaxial airline and an adapter for connecting the short airline to at least one test port of a network analyzer. The short airline is approximately one-quarter wavelength at the middle frequency of the measurement frequency range.

The invention allows use of a short length of transmission line, with only the required interface diameters on it. The length of the short airline in accordance with one embodiment of the invention is preferably chosen to be approximately 18 degrees of the wavelength in transmission at the lowest frequency and 162 degrees of the wavelength in transmission at the highest frequency of the desired calibration range. The inner and outer conductors are separate.

The inner conductor is connected to a mating inner conductor, such as the inner conductor of a network analyzer test port, by the adapter. Preferably, the inner conductor comprises a slotless female contact disclosed in Botka, U.S. Pat. No. 4,797,126 at one end and a male pin at the other end. This allows the manufacture of microwave calibration standards and precision connectors which reduce measurement uncertainties.

The outer conductor of the short airline is then attached coaxially with the inner conductor to the network analyzer test port or to the outer conductor of another element, such as a load or short. The test port of the network analyzer is preferably modified to provide the adapter which serves as a fixture for connection of the short airline to the network analyzer.

The adapter provides a two-position nut which serves as a fixture for connection of the short airline to the test port of the network analyzer. The adapter incorporates the two-position nut to couple to the mating threads on the other test port connector to clamp the short airline between the two halves of the connector pair. For example, the user who performs the calibration slides the nut forward on the adapter, installs the short airline, and connects a test port cable to the adapter. Connecting the nut to the threads on the cable clamps the short airline in place.

The electrically short airline in accordance with the invention provides a very precise element for use in calibrations of network analyzers. The short airline provides calibration capabilities over nearly a decade of frequency range (a stop to start frequency ratio of 9).

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings:

FIG. 2, comprising FIGS. 2A and 2B, is a cross-sectional view of one embodiment of a calibration standard in accordance with the invention comprising a short length of airline and an associated adapter;

FIG. 3 is a cross-sectional view of a coaxial form of electrically short airline in accordance with one embodiment of the invention;

FIG. 4, comprising

FIG. 5, comprising FIGS. 5A–5F, show a complete sequence of installation and removal of the short airline shown in FIG. 3; and FIG. 6, comprising FIGS. 6A–6F, show test configurations for each of three possible device under test configurations with the calibration standards in accordance with the invention.

DETAILED DESCRIPTION OF THE PREFERRED EMBODIMENTS

Figure 1:
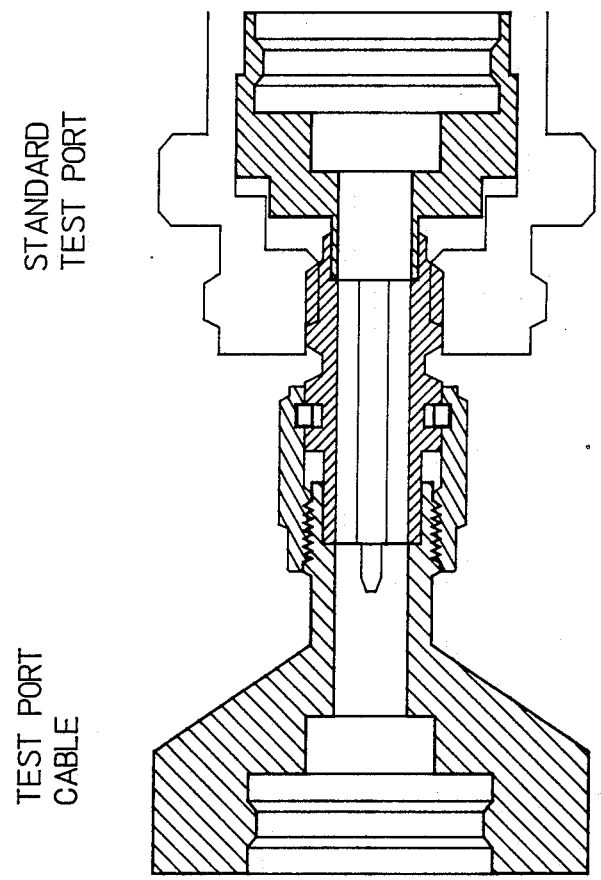
FIG. 1 is a cross-sectional view of a known coaxial transmission line connected for network analyzer calibration.

The present invention relates to the design and characterization of an electrically short coaxial transmission line element and adapters to connect this element to at least one test port, as well as between two test ports, of a network analyzer. The element is a short length of precision coaxial transmission line in the form of an airline which provides a phase shift that is not close to a multiple of 180 degrees over the measurement frequency range of interest. This short airline is constructed with a high degree of precision, and then its mechanical dimensions are measured to a high degree of accuracy. These measurements and the known loss of the short airline can then be used to calculate the scattering parameters of the line section. Preferably, the short airline comprises an element of a precision 3.5 mm calibration kit. This enables calibration of a network analyzer.

The technique for constructing a short airline depends upon the transmission medium. Let Phi be the one way phase shift through an airline at some frequency, F. Thus, $$Phi=(Beta)(L)=2(Pi)(L)/Lambda,$$

where L is the length of the airline, and Lambda is the wavelength at the given frequency. Now, since Lambda $=c/F$, where c is the speed of light ($3 \times 10^{10}$ cm/s), substituting into the above equation, $$Phi=2(Pi)(F)(L)/c \text{ radians}.$$

Therefore, since one radian equals $360/(2Pi)$ degrees, $$\begin{aligned} Phi &= 360(F)(L)/c \\ &= \frac{360(f \times 10^9)(L)}{3 \times 10^{10}} \\ &= 12fL \text{ degrees,} \end{aligned}$$

where f is the frequency in GHz, and L is the length of the transmission line in cm.

At midband (i.e., $f=f_{mid}=(f_{max}+f_{min})/2$), Phi is 90 degrees. (Phi must still equal less than 180 degrees at $f_{max}$.) Accordingly, the approximate length of the short airline that is required is calculated as $$L_{mid}=15/(f_{max}+f_{min}).$$

For example, approximately a 3.75 mm length is needed for a 7 GHz to 33 GHz frequency range in coaxial transmission line. In one embodiment of the invention, the length of the short airline is chosen to be approximately 18 degrees of the wavelength in transmission at the lowest frequency ($f_{min}$) and 162 degrees of the wavelength in transmission at the highest frequency ($f_{max}$) of the desired calibration range.

The following describes a configuration for a short, precise length of transmission airline in accordance with one embodiment of the invention. A calibration standard in accordance with the invention, generally indicated by the numeral 10, comprises a short coaxial airline 12, as shown in FIGS. 2 and 3. The short coaxial airline 12 has a length, for example, of approximately 3.9 mm for use in the 7 GHz to 33 GHz measurement frequency range.

As shown in FIG. 3, the short coaxial airline 12 comprises an outer conductor 14. The outer conductor 14 has two sides 14A and 14B. The outer conductor 14 is preferably constructed from a cylinder of gold-plated beryllium copper alloy, which is bored to provide a precise inside diameter.

The outer conductor 14 has an electrically active portion which spans the distance $L_s$. The side 14A is radiused at 14C to allow the outer conductor 14 to properly seat. The side 14B is longitudinally slotted to form a plurality of spring retaining fingers 14D. For example, six spring retaining fingers 14D can be provided. The interior of the outer conductor 14 is stepped between the side 14B and the electrically active portion, as shown at 14E, to provide spring compliance to the spring retaining fingers 14D. The side 14B is also radi-used at 14F to allow the outer conductor 14 to properly seat.

The short coaxial airline 12 also comprises an inner conductor 16. The inner conductor 16 is preferably constructed from gold-plated beryllium copper alloy.

The inner conductor 16 has an electrically active portion which spans the distance $\Delta L_s$. The inner conductor 16 comprises a male pin 18. The inner conductor 16 also comprises a precision slotless female contact 20, as disclosed in Botka, U.S. Pat. No. 4,797,126. The female end is slotless, since it has no slots on the outer portion of the inner conductor 16 and employs a fully contained inner contact comprising a plurality of inner contact fingers 22. A spring 24 disposed in the male pin 18 forces the inner contact fingers to press against an inner shoulder 20A of the slotless female contact 20 and the male pin. The outside diameter of the slotless female contact 20 is independent of diameter of an inserted male pin 26 (FIG. 2), which allows for accurate and independent determination of the impedance of the short airline 12.

Accordingly, the short airline 12 is a male-female or female-male coaxial transmission line. Male-male and female-female airlines having a similar configuration would have a greater length.

Figure 4A:
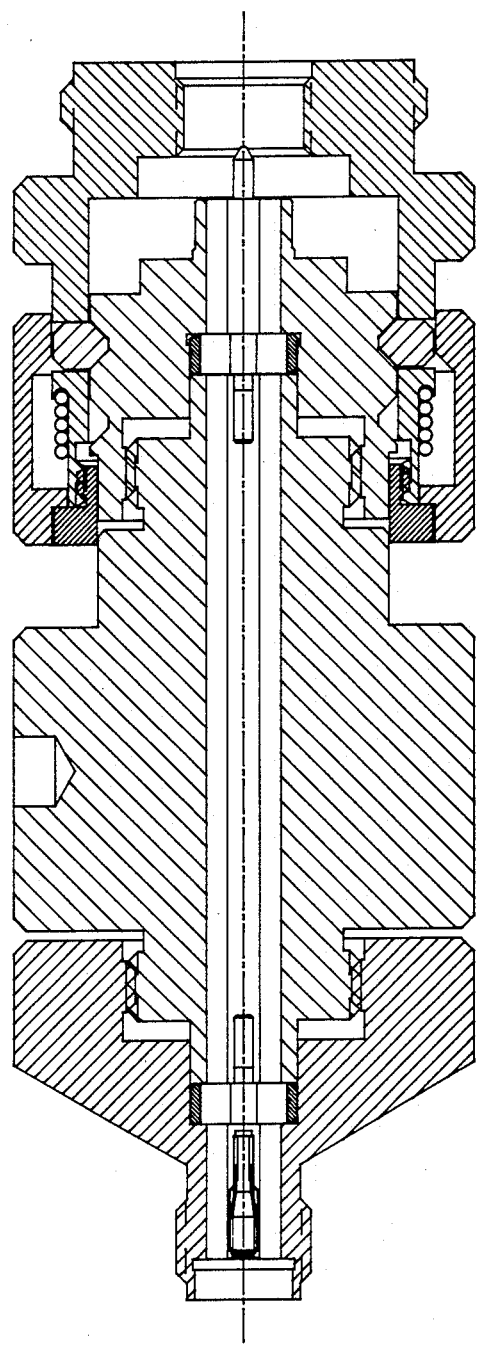
FIGS. 4A, 4B, and 4C, shows various adapters comprising the calibration standards in accordance with the invention.
Figure 4B:
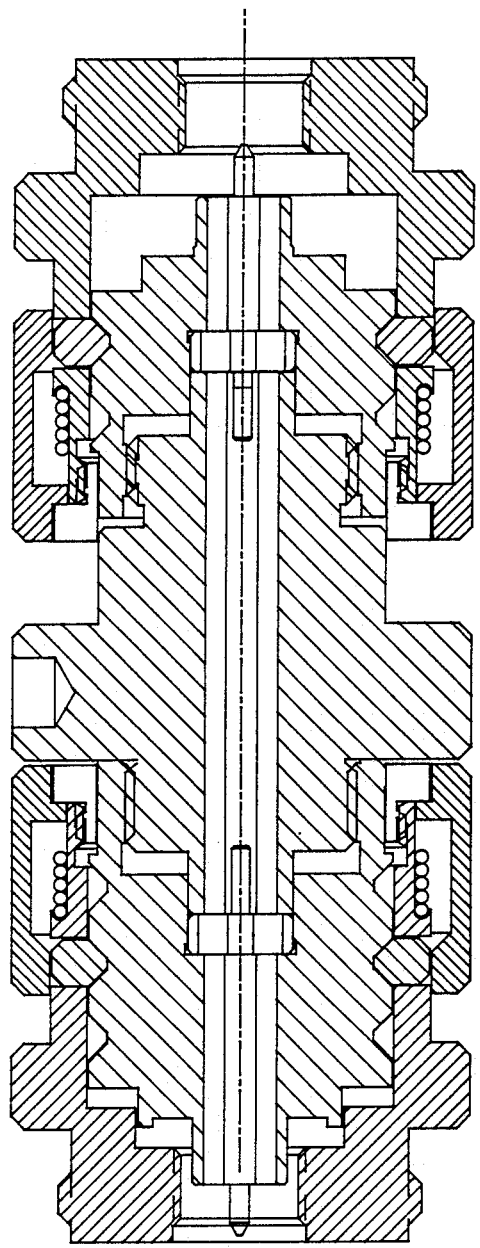

As shown in FIG. 2, the slotless female contact 20 is separately inserted onto the male pin 26 of a male end 28 of a first adapter 30A. The first adapter 30A can be a male-female adapter (FIG. 4A), useful for connection of the short airline 12 to a test port (not shown) of a network analyzer, or a male-male adapter (FIG. 4B), useful for connection of the short airline to a test port cable (not shown).

Figure 4C:
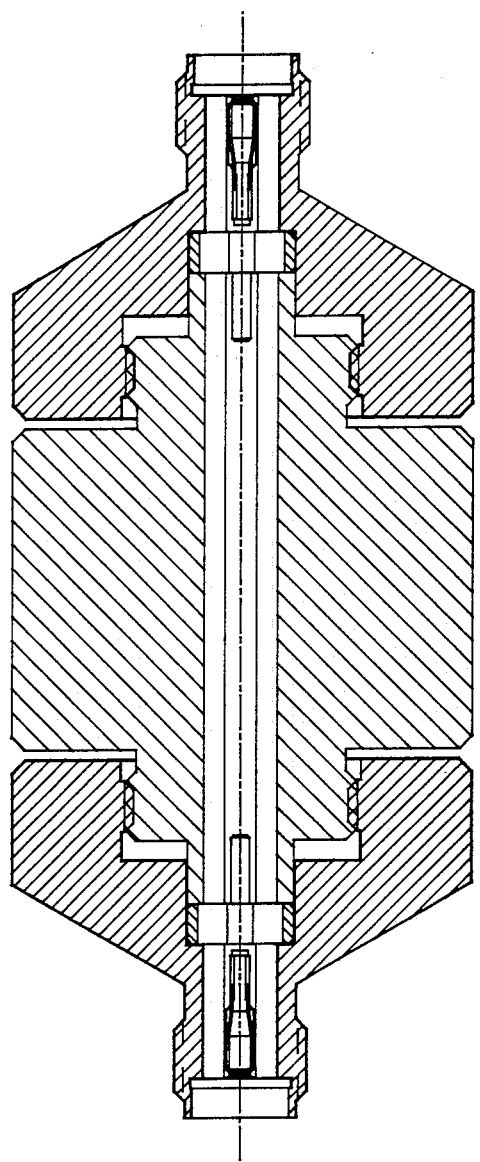

The male pin 18 is inserted into another slotless female contact 32 of a female end 34 of a second adapter 30B, as shown in FIG. 2. The second adapter 30B can be a female-male adapter (FIG. 4A), useful for connection of the short airline 12 to a test port cable (not shown), or a female-female adapter (FIG. 4C), useful for connection of the short airline to a test port (not shown) of a network analyzer (not shown).

Referring to FIG. 2, the outer conductor 14 is separately mounted between a male outer conductor 36 of the male end 28 of the first adapter 30A and a female outer conductor 38 of the female end 34 of the second adapter 30B. The remainder of the structure of the first and second adapters 30 facilitates connection of the short airline 12 between the adapters.

Considered in more detail, the male end 28 of the first adapter 30A comprises a body 40 having a central bore 42. The male outer conductor 36 has threads which mate with threads on the body 40 to interconnect the male outer conductor and the body. The male outer conductor 36 has a central bore 44 which aligns with the central bore 42 of the body 40 when the male outer conductor and the body are screwed together.

A center conductor 46 extends through the bores 42 and 44 and terminates in the male pin 26. As shown in FIG. 2, the center conductor 46 can comprise two parts interconnected by a threaded coupling 46A. The center conductor 46 is supported by an annular insulator, or bead, 48 surrounded by an annular metal ring 50 at the interface between the male outer conductor 36 and the body 40.

The first adapter 30A also incorporates a two-position nut 52 slidable along the male outer conductor 36 and the body 40. The two-position nut 52 is captured on the male outer conductor 36 by a locknut 54 which abuts a lip 36A of the male outer conductor.

A sliding sleeve 56 is provided which can be gripped by a user to move the two-position nut 52. A compression spring 58 preferably biases the sliding sleeve 56 to the position shown in FIG. 2A.

Also, a first groove 60 and a second groove 62 are provided on the circumference of the male outer conductor 36 to define the two positions of the two-position nut 52. A plurality of retainers 64 is captured between the two-position nut 52 and the sliding sleeve 56, on the one hand, and the male outer conductor 36 to hold the two-position nut in its first position in which the retainers reside in the first groove 60, as shown in FIG. 2A, or in its second position in which the retainers reside in the second groove 62, as shown in FIG. 2B.

Both the outer conductor 14 and the inner conductor 16 are accurately measured using laser micrometer lengths and outer diameter) and air gauges (inner diameter). In one implementation of the short coaxial airline 12, after being gold-plated, the inside diameter ($D_s$) of the outer conductor 14 is 3.500 plus or minus 0.0045 mm. The outside diameter ($d_s$) of the slotless female contact 20 of the inner conductor 16 is 1.520 plus or minus 0.002 mm. Preferably, numerous parts are produced, and the diameters ($D_s$ and $d_s$) of these parts are matched in the factory to assure a return loss greater than or equal to 56 dB. After the outer conductor 14 and the inner conductor 16 are goldplated with 0.635 to 0.889 mm of gold, the length ($L_s$) of the electrically active portion of the outer conductor is 3.900 plus or minus 0.0025 mm and the length ($\Delta L_s$) of the slotless female contact of the inner conductor is $L_s$ plus 0.0025 or minus 0.00762 mm.

Figure 2B:
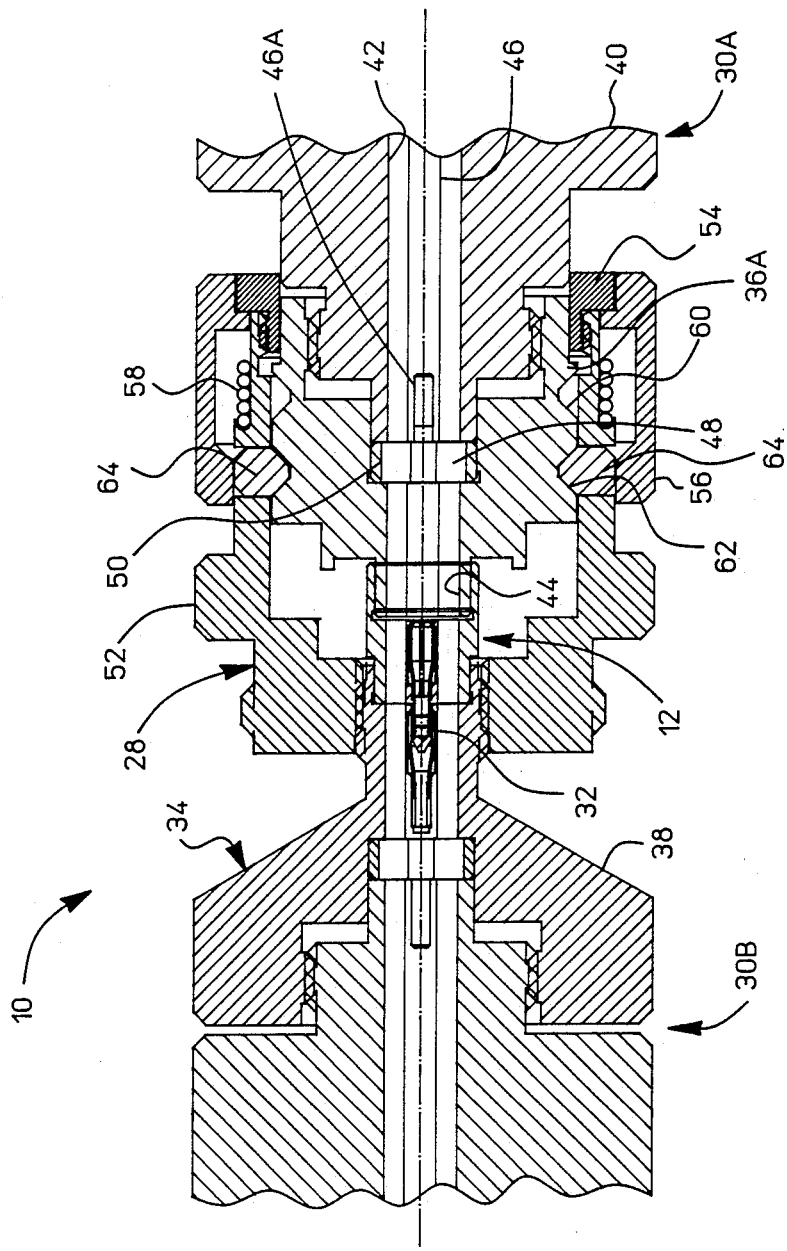

FIG. 2 shows the precision short transmission airline 12 with the slotless female contact 20 as it fits between two test port connectors or adapters 30 for calibration. The two-position nut 52 on the right can be locked in two positions. In the forward position shown at the top of FIG. 2, it accepts the added length of the short airline 12. After calibration it can be pulled back to its normal position shown in FIG. 2B to test the female ports of devices under test.

The expected electrical performance of the short airline 12 can be calculated using the mechanical dimensions and the equations in these two publications:

Nelson, Robert E., Marlene R. Coryell, "Electrical Parameters of Precision, Coaxial, Air-Dielectric Transmission Lines," U.S. National Bureau of Standards Monograph No. 96; and Somlo, P. I., "The Computation of Coaxial Line Step Capacitances," I.E.E.E. Transactions on Microwave Theory and Techniques, Volume MTT-15, No. 1, January, 1967.

The calculated performance can be used for a general idea of the expected device characteristic impedance. Variations in connector interfaces can have a large effect on actual electrical measurements. The short airline 12 and the adapters 30 have the following additional specifications.

| | |
|---|---|
| Calibration Temperature | Plus 20 degrees to plus 26 degrees Centigrade |
| Accuracy Enhanced Operating Temperature | Calibration Temperature plus or minus 1 degree Centigrade |
| Barometric Pressure Operation | Less than 4,500 meters (15,000 feet) |
| Relative Humidity | Non-Condensing at All Times |
| Operation | 0 to 80% (26 degrees Centigrade maximum dry bulb temperature) |
| Short Precision Airline | Greater than or equal to 56 dB Return Loss, 7 to 26.5 GHz |

After calibration measurement, performance verification and actual device measurements are preferably performed within the accuracy enhanced operating temperature specification. If the accuracy enhanced operating temperature deviates from the allowable range, a new calibration measurement is preferably performed to assure optimum accuracy.

The following describes a step-by-step procedure for connecting the short airline 12 to the adapters 30 supplied in the kit. The short airline 12 supplied in the kit can only be connected to the test port adapters 30 supplied in the kit. In order to obtain optimum calibration with the calibration kit, the test configuration includes one of these adapters 30 on each test set port.

All of the male ends on these adapters 30 have a unique two-position nut 52. In the first position, the adapter 30A looks and performs identically to any standard male test port, the second position is only used during calibration in order to be able to connect the short airline 12. Because the length of the short airline 12 is too short to accommodate the standard coupling threads and nut, the two-position nut 52 is designed to make connection possible. In a section to follow, instructions are outlined for the use of this two-position nut 52.

It is assumed that the proper test configuration is set up and that all adapters 30 and test port return cables have been connected and torqued properly. The short airline 12 in the precision calibration kit is shipped clamped within its holding tool. This holding tool has the specific purpose of installing, removing, and holding the short airline 12. Due to the short length of this airline, it is not recommended that either the outer or inner conductors be handled. If the holding tool is used properly, the short airline 12 will never have to be handled.

The short air line holding tool with short airline 12 is removed from the calibration kit box. The cap which protects the short airline 12 is detached. The short airline 12 is inspected to be sure the airline is completely installed in the tool. Next, the inner and outer conductors are checked for concentricity to one another in the tool; if not, they are adjusted until they are. Both the calibration components and the adapters 30 are properly cleaned prior to use per HP Application Note 326.

Prior to connecting the short airline 12, the male adapter 30 is checked to be sure that the two-position nut 52 is in the standard test port position. If it is in the correct position, it will appear the same as a standard test port; if not, the inner and outer conductors will appear to be deeply recessed inside the nut.

Figure 5A:
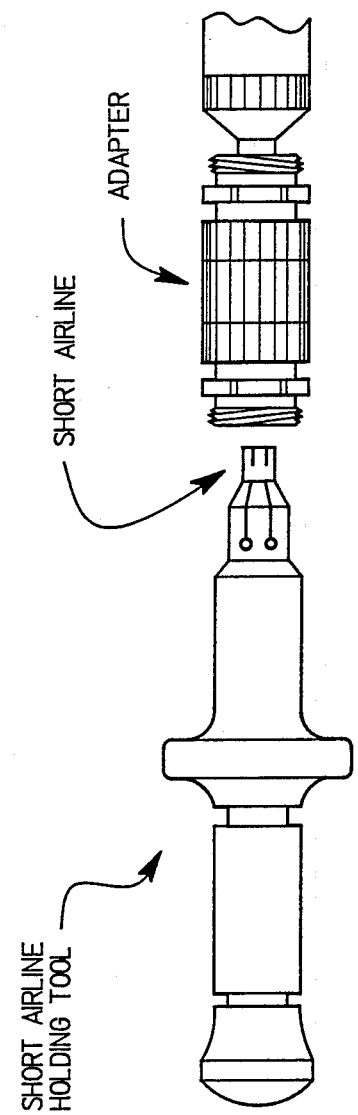
Figure 5B:
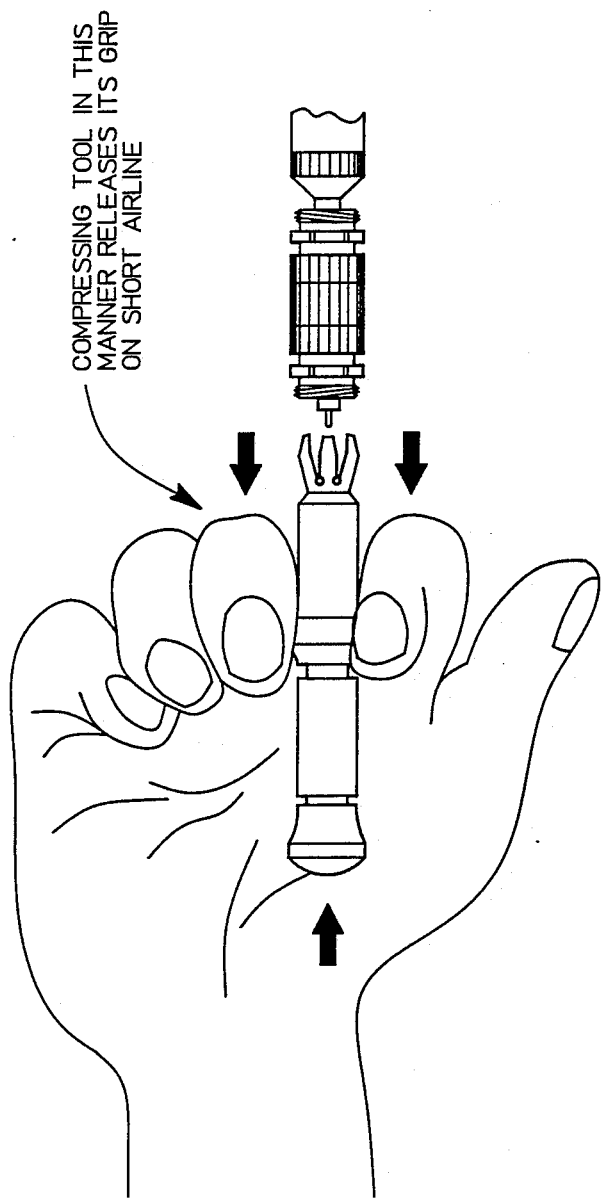

To install the short airline 12, the holding tool is utilized to guide the short airline onto the adapter 30A (FIG. 5A). The short airline 12 is carefully guided onto the adapter 30A until it bottoms and won't move anymore. At this point, the proper grip used on the holding tool is shown in FIG. 5B. The tool is removed from the short airline 12 with the airline connected to the test port by squeezing the tool, as shown in FIG. 5B. This opens the end of the tool and releases its grip on the short airline 12, leaving the airline connected.

Next, the short airline 12 is checked to assure that it is completely engaged onto the adapter 30 and that the inner and outer conductors are still concentric to one another (FIG. 5C). If they are not concentric, they are then centered.

At this point, the two-position nut 52 is slid on the adapter 30 into its second position. To do this, the knurled section is grasped just behind the hex nut, as shown in FIG. 5D, and is pulled forward towards the short airline 12. This sleeve will move forward and allow the nut to be pulled forward as well. The nut is pulled until the nut will not move anymore. At this point, the knurled sleeve is released, and the nut will lock in the forward position. In this position, the adapter 30 with the short airline 12 in place will appear like a normal test port again.

A second check is made that the inner and outer conductors are still concentric. This is important to avoid damaging the short airline 12 when completing the connection. Again, if the two are not concentric, they are then properly centered.

The short airline 12 is now ready for the remaining thru connection. The test port return cable (with the adapter 30B installed) is connected in the normal manner and torqued to 8 in-lbs using a torque wrench supplied in the calibration kit.

Figure 5E:
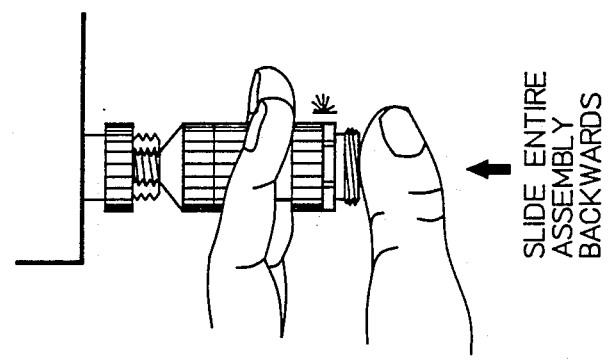
Figure 5E:
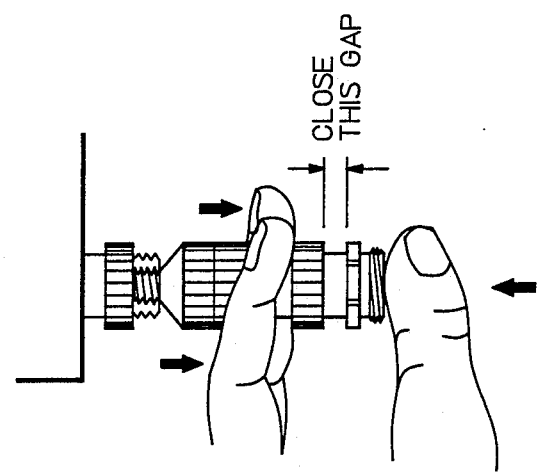

To remove the short airline 12, the test port return cable with adapter is disconnected from the airline. The short airline 12 is configured so that it will remain connected to the male adapter 30A. This will allow the short airline 12 to be removed using the short airline holding tool. If, for any reason, the inner or outer conductor remains on the female side, it is removed and replaced on the male side. The two-position nut 52 is then slid into its original standard position. To do this, the adapter 30A is grasped, as shown in FIG. 5E, and the knurled sliding sleeve is compressed up against the back of the hex nut, as shown. Keeping the sleeve against the nut, the entire assembly is pushed backward away from, and exposing, the short airline 12. Once the two-position nut 52 has moved completely back, the sliding sleeve is released. This will lock the two-position nut 52 in its original position.

The short airline 12 is now ready to be removed from the adapter 30A. The short airline holding tool is held, as shown in FIG. 5F between the end and the large diameter middle section. Checking one more time that the inner and outer conductors are concentric, the tool is carefully guided onto the short airline 12. The tool is pushed down onto the short airline 12 until the tapered end of the tool bottoms on the shoulder of the outer conductor. At this point, the tool should be gripping on both the inner and outer conductors. Slowly, the tool is withdrawn with the short airline 12 attached. If at this point either the inner or outer conductor remains on the adapter 30A, it is removed by hand and installed into the holding tool. FIG. 5B shows the proper method to grip the holding tool when installing either the inner or outer conductor by hand.

The short airline 12 and the adapters 30 can be used in connection with both traditional one-port and two-port network analyzer calibrations. The short airline 12 and the adapters 30 improve the accuracy with which a network analyzer can be calibrated, especially in the case of a Thru-Reflect-Line (TRL) calibration, which requires a single precision transmission line (in addition to a single unknown reflecting termination). This in turn provides a method for assessment of the residual errors in a network analyzer measurement and verification of performance of such a network analyzer. Using the calibration standards in accordance with the invention with precision connectors on an error-corrected microwave network analyzer reduces the measurement uncertainty from around plus or minus 2% to about plus or minus 0.3% using the same analyzer.

Several of the known calibration techniques, including Thru-Reflect-Line (TRL) and Thru-Short-Delay (TSD), are described in Engen, G. F., and Hoer, C. A., "'Thru-Reflect-Line': An Improved Technique for Calibrating the Dual Six-Port Automatic Network Analyzer," I.E.E.E. Trans. Microwave Theory Tech., Vol. MTT-27, No. 12, December, 1979, pp. 987-993. The short airline 12 and the adapters 30 in accordance with the invention apply to these as well as other calibration techniques. Preferably, a TRL calibration employing the short airline is used in the case of a two-port calibration. For example, the TRL calibration technique is a two-port calibration technique which by way of improvement would involve the following measurements: taking a measurement with a high-reflection termination, such as a short, connected directly across each test port of the network analyzer; taking a measurement with the short airline 12 and the adapters 30 interposed between the test ports; and taking a measurement with the two test ports connected together. The following section describes the theory of the TRL calibration.

The TRL two-port calibration technique is a three-step procedure. In step (1), the two ports of a network analyzer are connected together (thru connection) and the four S-parameters are measured. In step (2), an airline delay of unknown length and unknown propagation constant (but known $Z_0$) is connected, and four more S-parameter measurements are performed. For step (3), an unknown high reflection termination, such as an open or short, is connected to ports 1 and 2, and two reflection measurements are performed. A total of ten measurements are performed. Since only eight unknown error terms need to be determined, the redundant information can be used to calculate the propagation constant of the short airline 12 and the reflection coefficient of the short reflection termination that was placed on the network analyzer in step (3).

Step (1) is the thru connection. Note that the T-parameter matrix of the thru connection $[T_{AD}]$ is the identity matrix.

Step (2) is the delay connection. The T-parameters $[T_{AD}]$ for this also form a diagonal matrix, since the short airline 12 is assumed non-reflective. The length and loss of the short airline 12 are defined by $\gamma l$. The four S-parameters are measured for the thru and delay connection, then transformed to T-parameters. The two resultant matrix equations $[T_{MT}]$ and $[T_{MD}]$ can then be solved for the directivity terms ($e_{00}$ and $e_{33}$), the propagation constant ($\gamma l$) of the short airline 12, and two terms that are the ratio of the frequency responses ($e_{10}$ $e_{01}$) and ($e_{23}$ $e_{32}$) to port match terms $e_{11}$ and $e_{22}$.

Step (3) is to solve for the two-port match terms ($e_{11}$ and $e_{22}$) by using an unknown reflection. A high reflection is placed on port 1, and the reflection coefficient ($\Gamma_{MX}$) is measured. Then, the same reflection is placed on port 2, and $\Gamma_{MY}$ is measured. During the thru connection, port 1 of the reflectometer is utilized to measure the port match $e_{22}$, yielding $\Gamma_{M1}$. These three equations can be solved for the two-port matches ($e_{11}$ and $e_{22}$), the reflection coefficient of the unknown termination ($\Gamma_A$), and the reflection frequency response terms ($e_{10} e_{01}$, $e_{23} e_{32}$). The directivity, the frequency response, and the port match now have been determined for both reflectometers. The propagation constant ($\gamma l$) of the short airline 12 and the unknown termination ($\Gamma_A$) have also been determined. It is still necessary to determine the frequency response terms ($e_{10} e_{32}$ and $e_{23} e_{01}$) in transmission. The following equations show how this can be accomplished.

Because an airline has negligible shunt losses, $Z_0$ is defined as $\gamma l/j\omega Cl$. Since the propagation constant ($\gamma l$) was calculated as part of the calibration procedure, the only unknown remaining is the total capacitance of the airline (Cl). This capacitance is determined by actual physical dimensions of the airline. These physical dimensions become the standard.

Both the directivities and port matches achieved by this calibration method are almost as good as the return loss of the short airline 12 and are degraded only by the repeatability of the connectors and the system noise. In addition, the tracking error is reduced to almost zero. For example, a 50 dB return loss airline will yield 48 dB directivity and 48 dB port match on both ports, including the connector repeatability which is approximately 62 dB.

There are many advantages to the TRL calibration technique. The most important is that the characteristic impedance of the delay line is the only critical parameter. The frequency does not need to be extremely accurate, only repeatable. This technique is also applicable to unusual transmission media. For example, this is an excellent calibration technique for microstrip and stripline circuits where the section of the transmission line of an unknown length becomes the standard. Good open and short circuits, as well as precise electrical length lines, are often hard to achieve in non-coaxial media, but these are not problems with TRL calibration.

The short airline 12 can also be utilized in a one-port offset-load calibration for enhancement of the accuracy of a network analyzer. This calibration technique requires making measurements of a series of known devices, such as a load and a short, per se. and then through a length of the short transmission airline. An offset-load calibration comprises the following measurements: (a) a fixed load (stable, but not necessarily any better than 30 dB return loss); (b) the short airline 12 terminated with the same load; (c) a short circuit; and, (d) the short airline terminated with the same short circuit. The principal advantage of offset-load calibration over previous one-port calibration techniques is that only a single precision transmission line element is needed. The mechanical measurements of the short airline and the known loss of the short airline are used to calculate the scattering parameters ($S_{ij}$) of the line section.

Figure 6C:
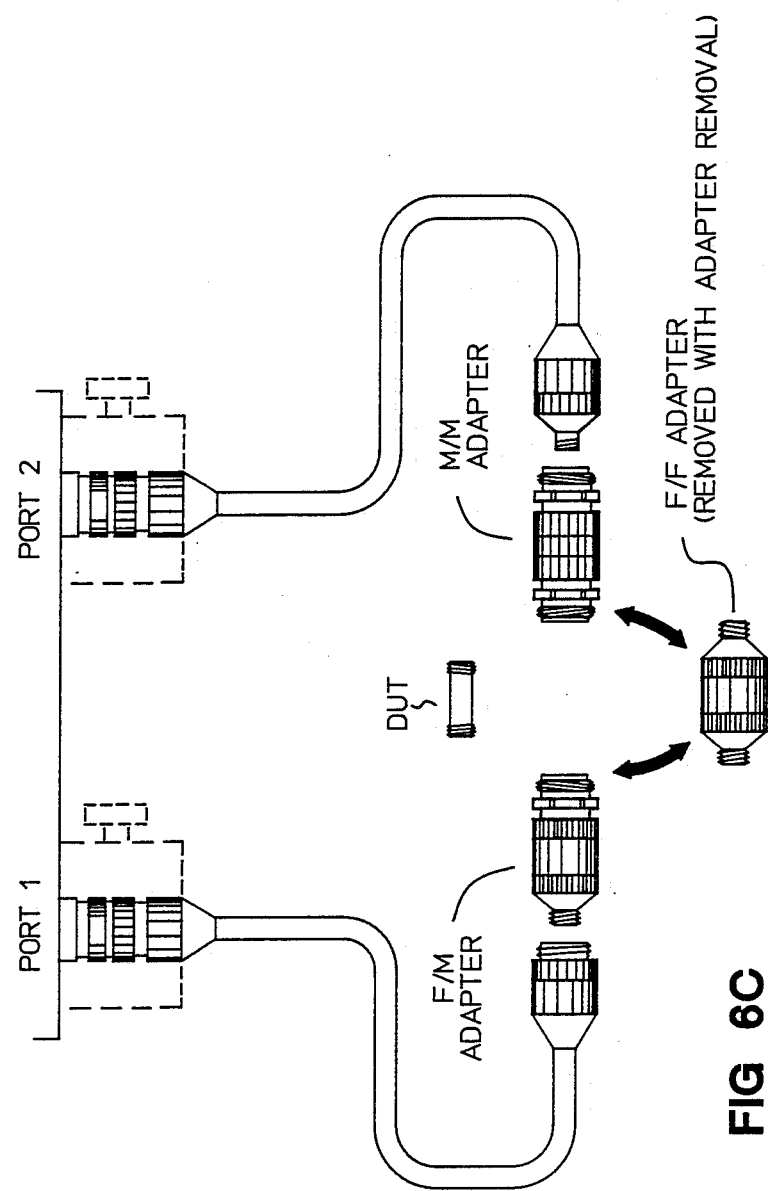
Figure 6E:
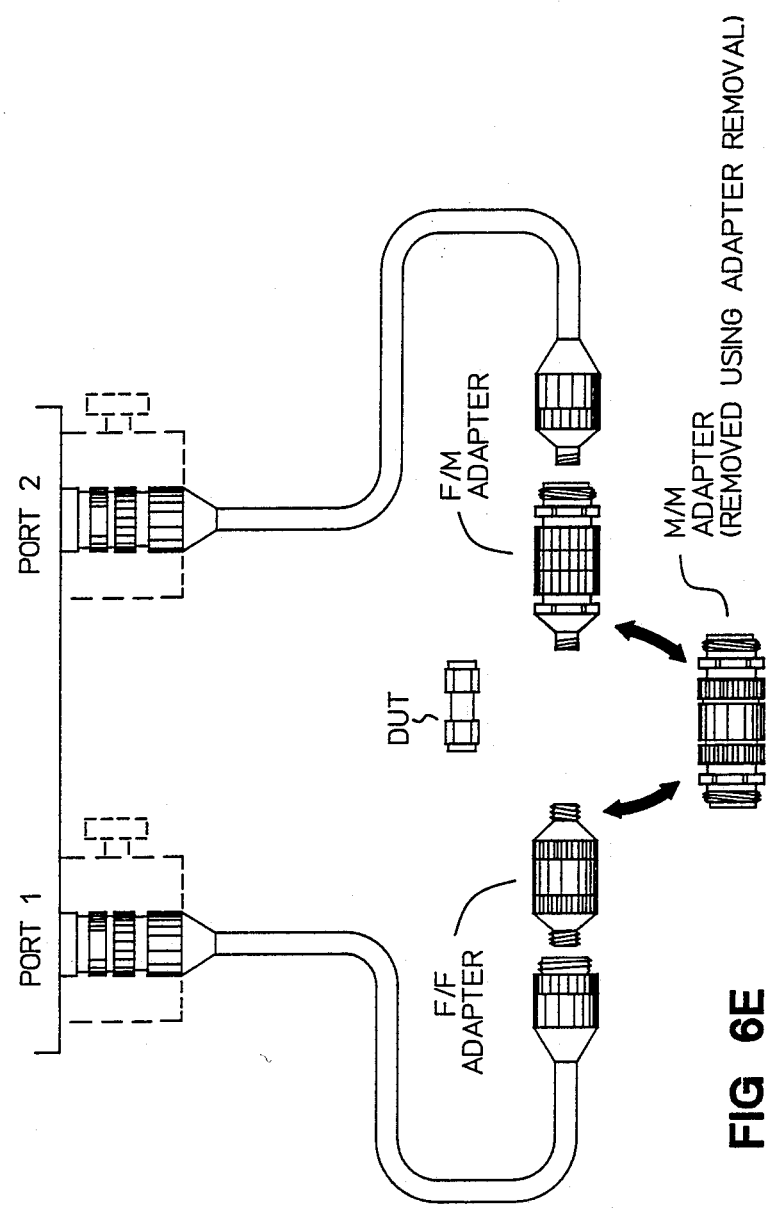
Figure 6F:
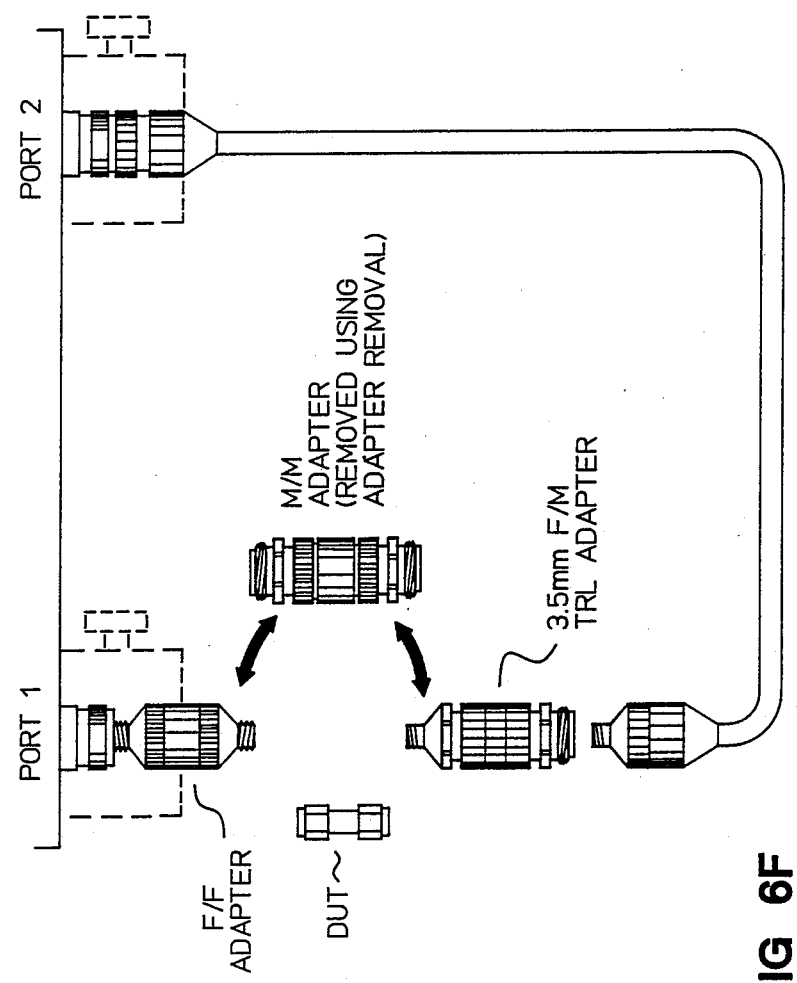

Due to the configuration of the short airline 12, and its requirement that it be connected to the male adapter 30A, the only sex test port which can be calibrated using offset calibrations is a male test port. FIGS. 6A–6F show all possible test configurations for each of the three possible device under test (DUT) combinations. FIGS. 6A and 6B show the test configuration for an insertable device, and FIGS. 6C–6F show configurations for non-insertable devices. As can be seen in these figures and as was stated above, the calibration must always be done between a pair of the adapters 30.

The invention allows for the use of a single short airline for calibration of a network analyzer. The only alternative would be to use two lines of different length. When two lines are used, the calibration is degraded by the dissimilarity of the two lines over their common length, as well as one more connector repeatability error on each side for connecting the second line. The manufacturing process allows making one line of very good quality, but to make two lines with matching impedance ($Z_0$) is much more difficult. The advantage is that the quality of calibration achievable with the one-line approach can be better and less expensive than with the two-line technique.

Various embodiments of the precision electrically short airline calibration standard in accordance with the invention have been described. Modifications will be obvious to persons skilled in the art that are within the spirit of this invention. The foregoing description is offered primarily for purposes of illustration. While a variety of embodiments has been disclosed, it will be readily apparent to those skilled in the art that numerous other modifications and variations not mentioned above can still be made without departing from the spirit and scope of the invention as claimed below.

What is claimed is:

1. A precision calibration standard, comprising:
   a short coaxial airline, the coaxial airline being approximately one-quarter wavelength at a middle frequency of a given measurement frequency range, the coaxial airline comprising:
      an inner conductor slidably connected at a first end by an adapter connected to a mating inner conductor of an external circuit; and
      an outer conductor separate from the inner conductor of the coaxial airline, the outer conductor being coaxially disposed to the inner conductor and connected by the adapter to an outer conductor of the external circuit;
   the adapter comprising a two-position nut which serves as a fixture for connection of the coaxial airline to the external circuit;
   the outer conductor of the coaxial airline being attached coaxially with the inner conductor by the adapter to the external circuit.

2. The calibration standard according to claim 1 wherein the inner conductor of the coaxial airline comprises a precision female slotless contact at the first end and a male pin at a second end.

3. The calibration standard according to claim 1 wherein the length of the coaxial airline is approximately 18 degrees of the wavelength in transmission at the lowest frequency and 162 degrees of the wavelength in transmission at the highest frequency of the given measurement frequency range.

4. The calibration standard according to claim 1 wherein the outer conductor of the coaxial airline has an electrically active portion which spans a distance $L_s$, the outer conductor of the coaxial airline comprising a first side and a second side, the first side being radiused to allow the outer conductor to properly seat and the second side being longitudinally slotted to form a plurality of spring retaining fingers, the interior of the outer conductor being stepped between the second side and the electrically active portion to provide spring compliance to the spring retaining fingers, the second side also being radiused to allow the outer conductor to properly seat.

5. The calibration standard according to claim 1, further comprising a precision female slotless contact connected to a second end of the inner conductor of the coaxial airline and connected by a second adapter to an inner conductor of a second external circuit for reliable interface at the second end of the coaxial airline inner conductor;

the first adapter further comprising threads on the two-position nut to couple to mating threads on the second adapter to clamp the coaxial airline between the two adapters, a user sliding the two-position nut forward on the first adapter, installing the coaxial airline, and threading the two adapters together to clamp the coaxial airline in place.

6. The calibration standard according to claim 5 wherein the first external circuit is a test port of a network analyzer and the second external circuit is one of a load, short, and cable.

7. The calibration standard according to claim 1 wherein the inner conductor of the coaxial airline has an electrically active portion which spans a distance $\Delta L_s$, the inner conductor of the coaxial airline comprising a male pin at the first end and a precision slotless female contact at a second end, the female contact being slotless in that it is characterized by having no slots on an outer portion of the inner conductor and employing a fully contained inner contact comprising a plurality of inner contact fingers, a spring being disposed in the male pin for forcing the inner contact fingers to press against an inner shoulder of the slotless female contact and the male pin, the outside diameter of the slotless female contact being independent of diameter of an inserted male pin, thereby allowing for accurate and independent determination of the impedance of the coaxial airline.

8. The calibration standard according to claim 7 wherein the slotless female contact is separately inserted onto a male pin of a male end of the first adapter, the first adapter being one of a male-female adapter, useful for connection of the coaxial airline to a test port of a network analyzer, and a male-male adapter, useful for connection of the coaxial airline to a test port cable.

9. The calibration standard according to claim 7 wherein the male pin is inserted into another slotless female contact of a female end of a second adapter, the second adapter being one of a female-male adapter, useful for connection of the coaxial airline to a test port cable, and a female-female adapter, useful for connection of the coaxial airline to a test port of a network analyzer.

10. The calibration standard according to claim 1 wherein the outer conductor of the coaxial airline is separately mounted between a male outer conductor of a male end of the first adapter and a female outer conductor of a female end of a second adapter.

11. The calibration standard according to claim 10 wherein the male end of the first adapter comprises a body having a central bore, the male outer conductor having threads which mate with threads on the body to interconnect the male outer conductor and the body, the male outer conductor having a central bore which aligns with the central bore of the body when the male outer conductor and the body are threaded together, further comprising a center conductor extending through the central bores and terminating in a male pin of the first adapter.

12. The calibration standard according to claim 11 wherein the center conductor comprises two parts interconnected by a threaded coupling, the center conductor being interconnected by a threaded coupling, the center conductor being supported by an annular insulator surrounded by an annular metal ring at an interface between the male outer conductor and the body of the first adapter.

13. The calibration standard according to claim 12 wherein the two-position nut is slidable along the male outer conductor and the body of the first adapter, the two-position nut being captured on the male outer conductor of the first adapter by a locknut which abuts a lip of the male outer conductor, the two-position nut further comprising a sliding sleeve, which can be gripped by a user to move the two-position nut between a first position and a second position, and a compression spring for biasing the sliding sleeve to the first position, a first groove and a second groove being provided on the circumference of the male outer conductor of the first adapter to define the two positions of the two-position nut, a plurality of retainers being captured between the two-position nut and the sliding sleeve, on the one hand, and the male outer conductor of the first adapter to hold the two-position nut in its first position in which the retainers reside in the first groove and alternatively in the second position in which the retainers reside in the second groove, the two-position nut in the first position accepting the added length of the coaxial airline, the two-position nut in the second position being pulled back so that the coaxial airline can be removed and the first adapter can be connected to a female port of a device under test.

14. A method for connecting a calibration standard comprising a short coaxial airline to a test port of a network analyzer, the short airline being approximately one-quarter wavelength at a middle frequency of a given measurement frequency range, comprising the steps of:

providing an adapter comprising a two-position nut which serves as a fixture for connection of the coaxial airline to the test port of the network analyzer;

slidably connecting a first end of an inner conductor of the coaxial airline by the adapter to a mating inner conductor of the test port of the network analyzer; and slidably connecting a first end of an outer conductor separate from the inner conductor of the coaxial airline by the adapter to an outer conductor of the test port of the network analyzer, the outer conductor being coaxially disposed to the inner conductor and connected by the adapter to the outer conductor of the test port of the network analyzer;

the outer conductor of the coaxial airline being attached coaxially with the inner conductor to the test port of the network analyzer by the adapter.

15. The method according to claim 14, further comprising the steps of:

providing a precision female slotless contact connected to a second end of the inner conductor of the coaxial airline;

providing a second adapter for connecting the coaxial airline to an inner conductor of an external circuit for reliable interface at the second end of the coaxial airline inner conductor; and providing threads on the two-position nut to couple to mating threads on the second adapter to clamp the coaxial airline between the two adapters, a user sliding the two-position nut forward on the first adapter, installing the coaxial airline, and threading the two adapters together to clamp the coaxial airline in place.

16. The method according to claim 14 wherein the external circuit is one of a load, short, and cable.

* * * * *

UNITED STATES PATENT AND TRADEMARK OFFICE
CERTIFICATE OF CORRECTION

PATENT NO. : 4,967,173

DATED : October 30, 1990

INVENTOR(S) : Paul B. Watson

It is certified that error appears in the above-identified patent and that said Letters Patent is hereby corrected as shown below:

Column 4, line 47 "show" should be --shows--; line 50 "show" should be --shows--.

Column 7, line 19 "lengths" should be --(lengths--; lines 39-40 "at the top of Fig. 2" should be --in Fig. 2A"--.

Column 8, line 47 "air line" should be --airline--; line 57 "30" should be --30A--.

Column 9, line 5 "30" should be --30A--; line 10 "30" should be --30A--; line 18 "30" should be --30A--; line 49 "Fig. 5F" should be --Fig. 5F,"--.

Column 10, line 40 "tWo" should be --two--; line 46 "short" should be --high--.

Signed and Sealed this

Fifth Day of January, 1993

*Attest:*

DOUGLAS B. COMER

*Attesting Officer*   Acting Commissioner of Patents and Trademarks